United States Patent
Moroz et al.

(10) Patent No.: US 7,199,327 B2
(45) Date of Patent: Apr. 3, 2007

(54) METHOD AND SYSTEM FOR ARC SUPPRESSION IN A PLASMA PROCESSING SYSTEM

(75) Inventors: Paul Moroz, Marblehead, MA (US); Eric Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 150 days.

(21) Appl. No.: 10/512,862

(22) PCT Filed: Jun. 27, 2003

(86) PCT No.: PCT/US03/16243

§ 371 (c)(1),
(2), (4) Date: Nov. 15, 2004

(87) PCT Pub. No.: WO2004/003968

PCT Pub. Date: Jan. 8, 2004

(65) Prior Publication Data

US 2006/0081564 A1    Apr. 20, 2006

Related U.S. Application Data

(60) Provisional application No. 60/391,950, filed on Jun. 28, 2002.

(51) Int. Cl.
*B23K 10/00* (2006.01)
(52) U.S. Cl. .................. 219/121.41; 219/121.43; 219/121.54; 219/121.4; 156/345.24
(58) Field of Classification Search ............ 219/121.4, 219/121.41, 121.54, 121.43; 156/349.24, 156/345.48

See application file for complete search history.

(56) References Cited

U.S. PATENT DOCUMENTS

| | | | |
|---|---|---|---|
| 5,192,894 A | | 3/1993 | Teschner |
| 5,241,152 A | * | 8/1993 | Anderson et al. ...... 219/121.57 |
| 5,286,360 A | * | 2/1994 | Szczyrbowski et al. ............ 204/298.08 |
| 5,584,972 A | * | 12/1996 | Lantsman ............ 204/192.12 |
| 5,611,899 A | | 3/1997 | Maass |
| 5,993,615 A | | 11/1999 | Abry et al. |
| 6,332,961 B1 | | 12/2001 | Johnson et al. |
| 6,802,933 B2 | * | 10/2004 | Khan et al. ............ 156/345.26 |

* cited by examiner

*Primary Examiner*—Mark Paschall
(74) *Attorney, Agent, or Firm*—Oblon, Spivak, McClelland, Maier & Neustadt, P.C.

(57) ABSTRACT

An arc suppression system for plasma processing comprising at least one sensor coupled to the plasma processing system, and a controller coupled to the at least one sensor. The controller provides at least one algorithm for determining a state of plasma in contact with a substrate using at least one signal generated from the at least one sensor and controlling a plasma processing system in order to suppress an arcing event. When voltage differences between sensors exceed a target difference, the plasma processing system is determined to be susceptible to arcing. During this condition, an operator is notified, and decision can be made to either continue processing, modify processing, or discontinue processing.

64 Claims, 17 Drawing Sheets

METHOD AND SYSTEM FOR ARC SUPPRESSION IN A PLASMA PROCESSING SYSTEM

CROSS-REFERENCE TO RELATED APPLICATIONS

This application claims priority to U.S. Application Ser. No. 60/391,950, filed Jun. 28, 2002; and this application is related to U.S. Pat. No. 6,332,961, entitled "Device and method for detecting and preventing arcing in RF plasma systems," the entire contents of which are incorporated herein by reference.

BACKGROUND OF THE INVENTION

1. Field of the Invention

The present invention relates to plasma processing and more particularly to an arc suppression system for plasma processing and a method of using thereof.

2. Discussion of the Background

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate). Typically, during plasma processing such as etch applications, it is likely that electric charge will accumulate across the substrate surface. However, it is possible that the substrate charging can be spatially non-homogeneous across the substrate surface. The non-homogeneous charging of the substrate surface has been observed to arise due to a spatially non-homogeneous plasma overlying and in contact with the substrate surface. The plasma non-homogeneity can be attributed to, for example, non-uniform plasma generation or loss resulting in a non-uniform plasma density, or a non-uniform plasma sheath overlying the substrate surface associated with the plasma reactor structure surrounding the substrate resulting in a non-uniform ion energy (for ions striking the substrate surface). As a consequence of these non-homogeneities, the risk of lateral arcing across the substrate is greatly enhanced. Substrate arcing must be avoided entirely in order to preserve acceptable device yield.

SUMMARY OF THE INVENTION

The present invention provides an arc suppression system for a plasma processing system comprising at least one sensor capable of being coupled to the plasma processing system, and a controller coupled to the at least one sensor, wherein the controller provides at least one algorithm for determining a state of the plasma processing system using at least one signal generated from the at least one sensor and controlling a plasma processing system in order to suppress an arcing event.

The present invention further provides a method for suppressing arcing in the plasma processing system utilizing the arc suppression system comprising the steps: measuring at least one signal related to the plasma processing system using at least one sensor; determining at least one difference signal between the at least one signal and ground potential; comparing the at least one difference signal to a target difference; and determining a state of the plasma processing system from the comparing.

The present invention further provides another method for suppressing arcing in the plasma processing system utilizing the arc suppression system comprising the steps: measuring a first signal related to the plasma processing system using a first sensor; measuring a second signal related to the plasma processing system using a second sensor; determining a difference signal between the first signal and the second signal; comparing the difference signal to a target difference; and determining a state of the plasma processing system from the comparing.

It is another object of the present invention to provide a method for suppressing arcing in the plasma processing system utilizing the arc suppression system further comprising the step: controlling the plasma processing system according to the state of the plasma processing system in order to suppress an arcing event

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

Figure 1:
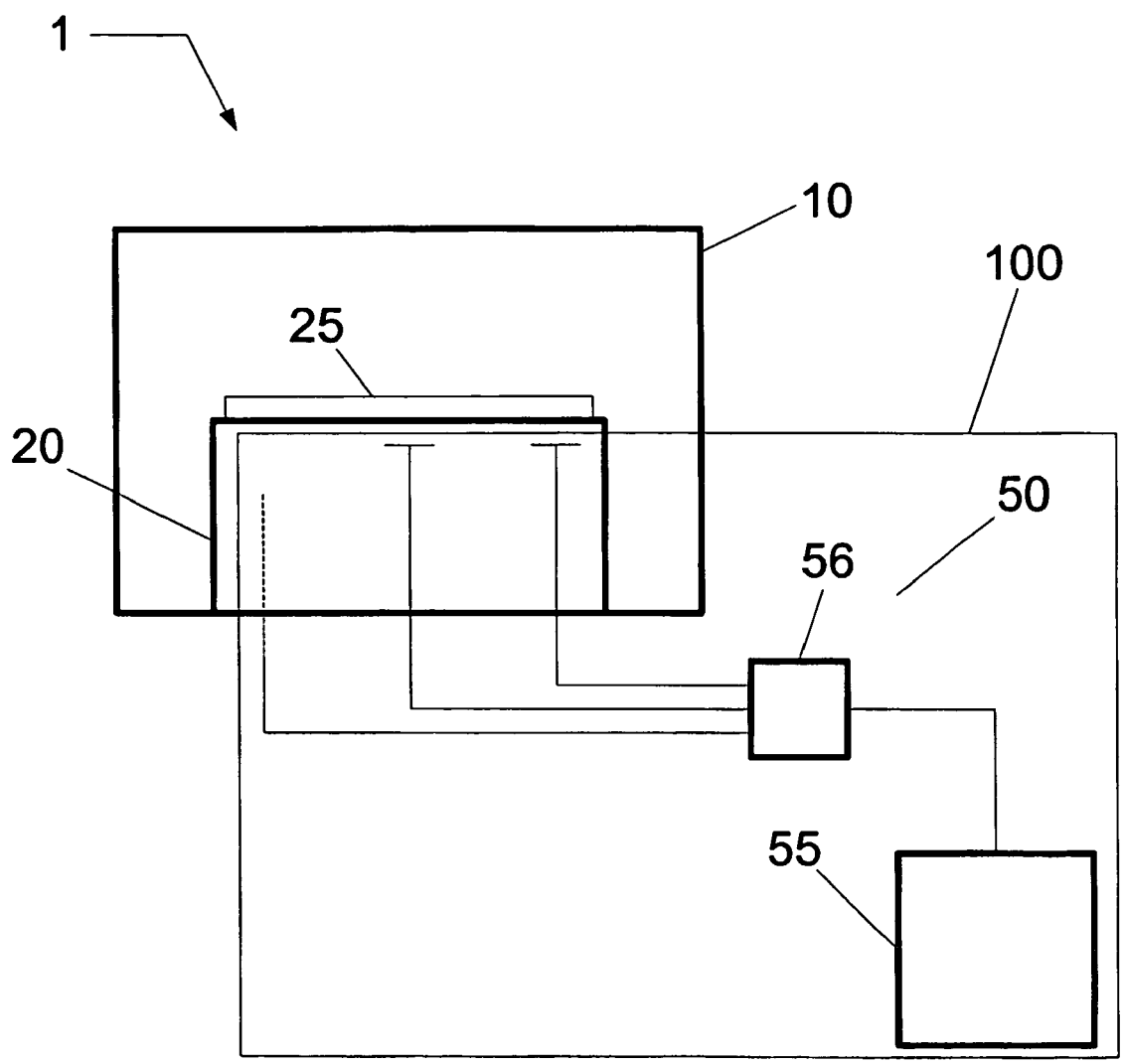
FIG. 1 shows an arc suppression system for plasma processing according to a preferred embodiment of the present invention.

According to an embodiment of the present invention, a plasma processing system 1 is depicted in FIG. 1 comprising a process reactor 10, a substrate holder 20 to support a substrate 25, and an arc suppression system 100, wherein the arc suppression system 100 comprises at least one sensor 50 coupled to the process reactor 10, and a controller 55 coupled to the at least one sensor 50. Moreover, the controller 55 is capable of executing at least one algorithm for determining a state of the plasma processing system 1 using at least one signal generated from the at least one sensor 50 and controlling the plasma processing system 1 in order to suppress an arcing event.

In one embodiment of the present invention, the at least one sensor 50 can comprise at least one antenna, and an electrical measurement device 56 coupled to each antenna. In an alternate embodiment, the at least one antenna comprises at least one antenna electrode 52, and an antenna lead 54 coupled to the at least one antenna electrode 52.

In the illustrated embodiment, plasma processing system 1, depicted in FIG. 1, utilizes a plasma for material processing. Desirably, plasma processing system 1 comprises an etch chamber. Alternately, plasma processing system 1 can comprise a deposition chamber such as a chemical vapor deposition (CVD) system or a physical vapor deposition (PVD) system.

Figure 2:
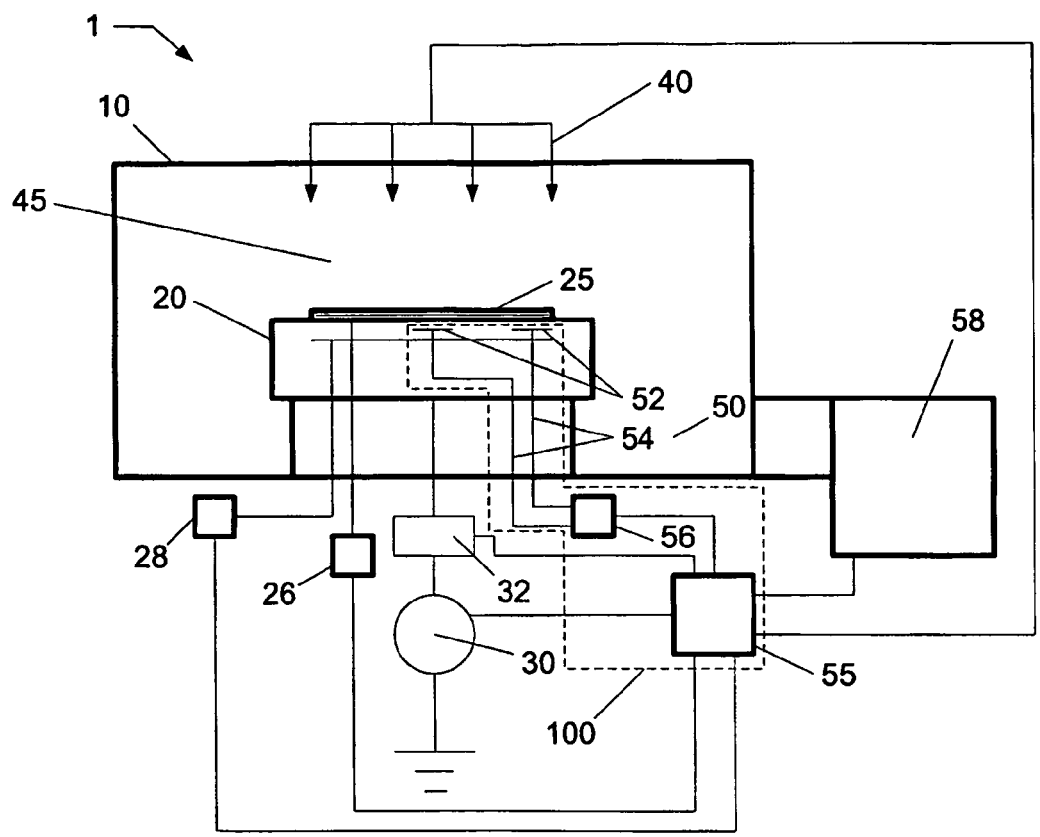
FIG. 2 shows an arc suppression system for plasma processing according to an alternate embodiment of the present invention.

According to the illustrated embodiment of the present invention depicted in FIG. 2, plasma processing system 1 can comprise process reactor 10, substrate holder 20, upon which a substrate 25 to be processed is affixed, gas injection system 40, and vacuum pumping system 58. Substrate 25 can be, for example, a semiconductor substrate, a wafer, or a liquid crystal display (LCD). Process reactor 10 can be, for example, configured to facilitate the generation of plasma in processing region 45 adjacent a surface of substrate 25, wherein plasma is formed via collisions between heated electrons and an ionizable gas. For example, an ionizable gas or mixture of gases can be introduced via gas injection system 40, and the process pressure can be adjusted using vacuum pumping system 58. Desirably, plasma is utilized to create materials specific to a pre-determined materials process, and to aid either the deposition of material to substrate 25 or the removal of material from the exposed surfaces of substrate 25.

For example, the substrate 25 can be affixed to the substrate holder 20 via an electrostatic clamping system 28. Furthermore, substrate holder 20 can further include a cooling system including a re-circulating coolant flow that receives heat from substrate holder 20 and transfers heat to a heat exchanger system (not shown), or when heating, transfers heat from the heat exchanger system. Moreover, gas can be delivered to the back-side of the substrate via a backside gas system 26 to improve the gas-gap thermal conductance between substrate 25 and substrate holder 20. Such a system can be utilized when temperature control of the substrate is required at elevated or reduced temperatures. For example, temperature control of the substrate can be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermo-electric heaters/coolers can be included.

In the exemplary embodiment shown in FIG. 2, substrate holder 20 can further serve as an electrode through which RF power is coupled to plasma in processing region 45. For example, substrate holder 20 can be electrically biased at a RF voltage via the transmission of RF power from RF generator 30 through impedance match network 32 to substrate holder 20. The RF bias can serve to heat electrons and, thereby, form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz and is preferably 13.56 MHz. RF systems for plasma processing are well known to those skilled in the art.

Alternately, RF power can be applied to the substrate holder electrode at multiple frequencies. Furthermore, impedance match network 32 can serve to maximize the transfer of RF power to plasma in process reactor 10 by minimizing the reflected power. Match network topologies (e.g. L-type, π-type, T-type, etc.) and automatic control methods are well known to those skilled in the art.

With continuing reference to FIG. 2, process gas can be introduced to processing region 45 through gas injection system 40. Process gas can, for example, comprise a mixture of gases such as Argon, $CF_4$ and $O_2$, or Argon, $C_4F_8$ and $O_2$ for oxide etch applications, or other chemistries such as $O_2/CO/Ar/C_4F_8$, $O_2/CO/AR/C_5F_8$, $O_2/CO/Ar/C_4F_6$, $O_2/Ar/C_4F_6$, $N_2/H_2$. Gas injection system 40 can comprise a showerhead, wherein process gas is supplied from a gas delivery system (not shown) to the processing region 45 through a gas injection plenum (not shown), a series of baffle plates (not shown) and a multi-orifice showerhead gas injection plate (not shown). Gas injection systems are well known to those of skill in the art.

Vacuum pump system 58 can, for example, include a turbo-molecular vacuum pump (TMP) capable of a pumping speed up to 5000 liters per second (and greater) and a gate valve for throttling the chamber pressure. In conventional plasma processing devices utilized for dry plasma etching, a 1000 to 3000 liter per second TMP is generally employed. TMPs are useful for low pressure processing, typically less than 50 mTorr. At higher pressures, the TMP pumping speed falls off dramatically. For high pressure processing (i.e. greater than 100 mTorr), a mechanical booster pump and dry roughing pump can be used. Furthermore, a device for monitoring chamber pressure (not shown) is coupled to the process reactor 10. The pressure measuring device can be, for example, a Type 628B Baratron absolute capacitance manometer commercially available from MKS Instruments, Inc. (Andover, Mass.).

For example, controller 55 can comprise a microprocessor, memory, and a digital I/O port capable of generating control voltages sufficient to communicate and activate inputs to plasma processing system 1 as well as monitor outputs from plasma processing system 1. Moreover, controller 55 is further coupled to and exchanges information with RF generator 30, impedance match network 32, gas injection system 40, vacuum pump system 58, backside gas delivery system 26, electrostatic clamping system 28, and sensor 50. A program stored in the memory is utilized to activate the inputs to the aforementioned components of a plasma processing system 1 according to a stored process recipe. One example of controller 55 is a DELL PRECISION WORKSTATION 610™, available from Dell Corporation, Dallas, Tex. Alternately, controller 55 can comprise a Digital Signal Processor (DSP).

Figure 3:
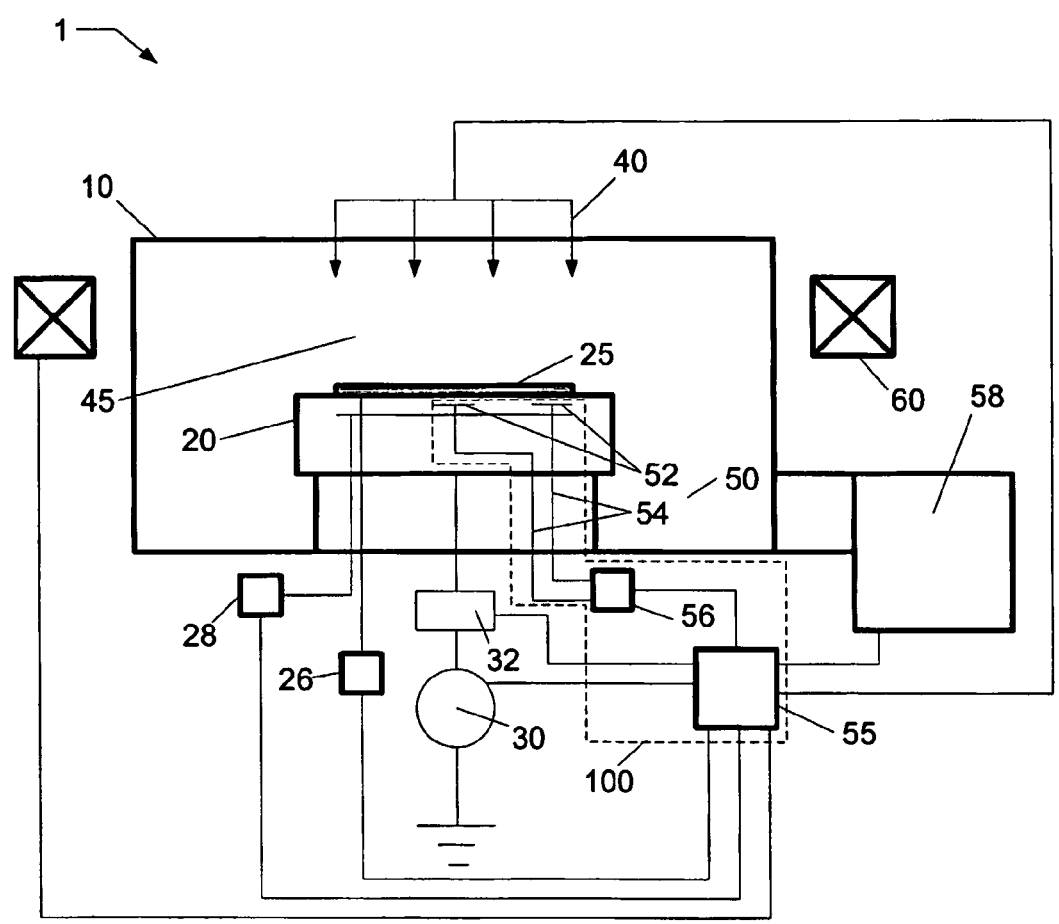
FIG. 3 shows an arc suppression system for plasma processing according to another embodiment of the present invention.

In the exemplary embodiment shown in FIG. 3, the plasma processing system 1 can further comprise a magnetic field system 60. For example, magnetic system 60 can comprise a stationary or either a mechanically or electrically rotating DC magnetic field system, in order to potentially increase plasma density and/or improve plasma processing uniformity. Moreover, controller 55 can be coupled to a rotating magnetic field system in order to regulate the speed of rotation and field strength. The design and implementation of a rotating magnetic field is well known to those skilled in the art.

Figure 4:
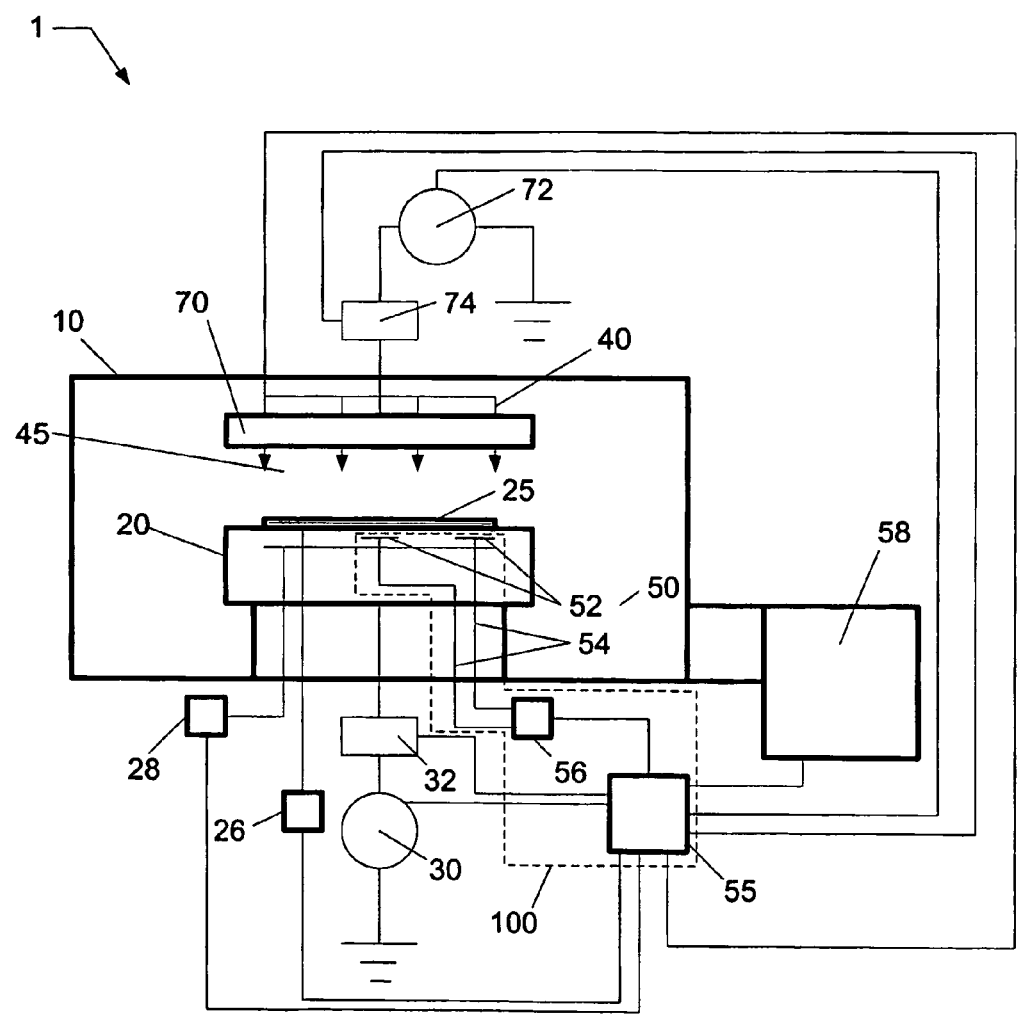
FIG. 4 shows an arc suppression system for plasma processing according to another embodiment of the present invention.

In the exemplary embodiment shown in FIG. 4, the plasma processing system 1 of FIGS. 1 and 2 can further comprise an upper electrode 70 to which RF power can be coupled from RF generator 72 through impedance match network 74. A typical frequency for the application of RF power to the upper electrode can range from 10 MHz to 200 MHz and is preferably 60 MHz. Additionally, a typical frequency for the application of power to the lower electrode can range from 0.1 MHz to 30 MHz and is preferably 2 MHz. Moreover, controller 55 is coupled to RF generator 72 and impedance match network 74 in order to control the application of RF power to upper electrode 70. The design and implementation of an upper electrode is well known to those skilled in the art.

Figure 5:
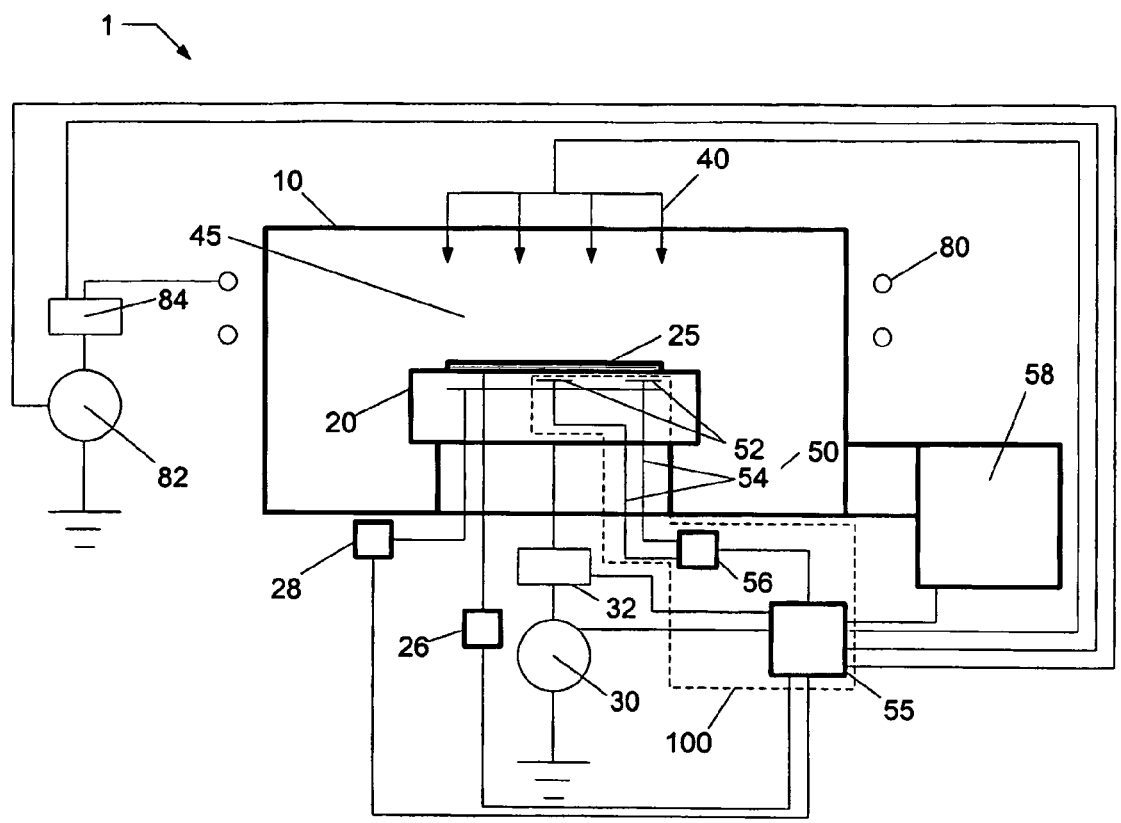
FIG. 5 shows an arc suppression system for plasma processing according to an additional embodiment of the present invention.

In the exemplary embodiment shown in FIG. 5, the plasma processing system of FIGS. 1 and 2 can, for example, further comprise an inductive coil 80 to which RF power is coupled via RF generator 82 through impedance match network 84. RF power is inductively coupled from inductive coil 80 through dielectric window (not shown) to plasma processing region 45. A typical frequency for the application of RF power to the inductive coil 80 can range from 10 MHz to 100 MHz and is preferably 13.56 MHz. Similarly, atypical frequency for the application of power to the chuck electrode can range from 0.1 MHz to 30 MHz and is preferably 13.56 MHz. In addition, a slotted Faraday shield (not shown) can be employed to reduce capacitive coupling between the inductive coil 80 and plasma. Moreover, controller 55 is coupled to RF generator 82 through impedance match network 84 in order to control the application of power to inductive coil 80. In an alternate embodiment, inductive coil 80 can be a "spiral" coil or "pancake" coil in communication with the plasma processing region from above as in a transformer coupled plasma (TCP) reactor. The design and implementation of an inductively coupled plasma (ICP) source and/or transformer coupled plasma (TCP) source is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

As discussed above, arc suppression system 100 comprises at least one sensor 50 coupled to the process reactor 10, and controller 55 coupled to the at least one sensor 50, wherein controller 55 is capable of executing at least one algorithm for determining a state of plasma processing system 1 using at least one signal generated from the at least one sensor 50 and controlling a plasma processing system 1 in order to suppress an arcing event. In the following discussion, the arc suppression system 100 is discussed in greater detail.

Figure 6:
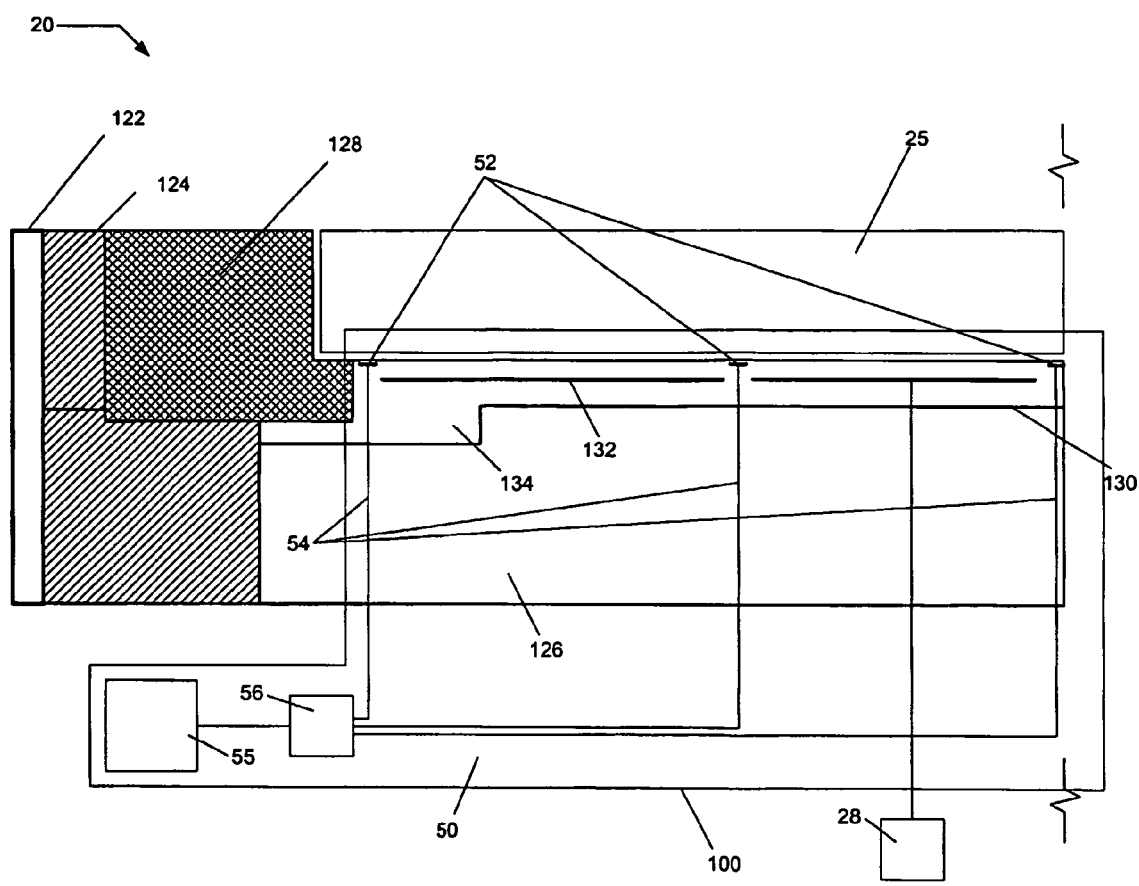
FIG. 6 shows an exploded view of a substrate holder incorporating an arc suppression system according to an embodiment of the present invention.

Referring now to FIG. 6, an exploded view of a cross-section of substrate holder 20 is presented. In general, the substrate holder 20 can comprise an outer shield 122, an isolation ring 124, a RF biasable electrode 126 underlying substrate 25 and a focus ring 128 surrounding the substrate 25. The outer shield 122 can be, for example, an electrically grounded conductive element comprising a material such as aluminum with or without surface anodization and/or a surface coating (e.g. $Y_2O_3$). The isolation ring 124 provides electrical insulation between the RF biasable electrode 126 and the outer shield 122, and it can, for example, comprise a dielectric material such as, for example, alumina, quartz, etc. The RF biasable electrode 126 can be biased with RF energy from a RF generator such as the RF generator depicted in FIGS. 2 through 5. Alternately, RF biasable electrode 126 can be grounded. The RF biasable electrode 126 can comprise a conductive material such as aluminum. The focus ring 128 generally serves to affect the etch or deposition processes occurring at the periphery of substrate 25 in a manner that permits uniform processing of substrate 25 over the entirety of its surface. The focus ring 128 can comprise a material such as silicon, carbon, silicon carbide, etc.

In addition to the above identified features, an electrostatic clamping device 130 can be formed within the upper surface of the RF biasable electrode 126. The electrostatic clamping device 130 comprises a clamp electrode 132 embedded within an insulation layer 134, wherein the clamp electrode 132 is biased with a DC voltage supplied from a high voltage DC voltage source (identified as part of electrostatic clamping system 28 in FIGS. 2 through 5). In conventional electrostatic clamping devices, the clamp electrode 132 is fabricated from a material such as copper, nickel, chromium, aluminum, iron, tungsten and alloys thereof, and the insulation layer 134 is fabricated from a ceramic, glass or high temperature polymer material such as alumina $Al_2O_3$, quartz $SiO_2$, aluminum nitride AlN, $Si_3N_4$, $ZrO_2$, silicon carbide SiC, boron nitride BN, glass ceramic, and polyimide materials. Methods for fabricating an electrostatic clamping device 130 comprising a clamp electrode 133 and ceramic layer 134 and the means by which a high voltage, DC signal is coupled to clamp electrode 132 are well known to those skilled in the art of electrostatic chucks.

Figure 7A:
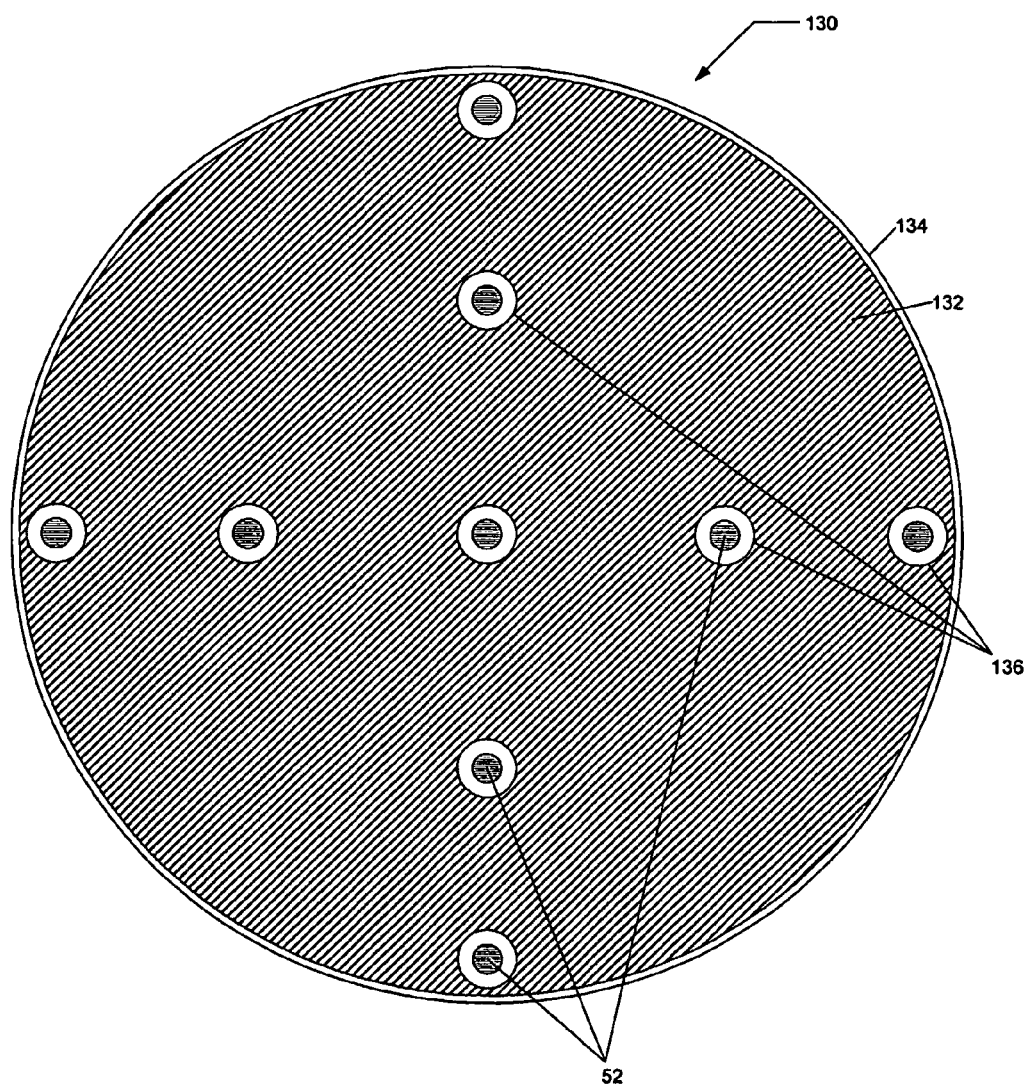
FIG. 7A shows a top view of a substrate holder incorporating an arc suppression system according to an embodiment of the present invention.
Figure 7B:
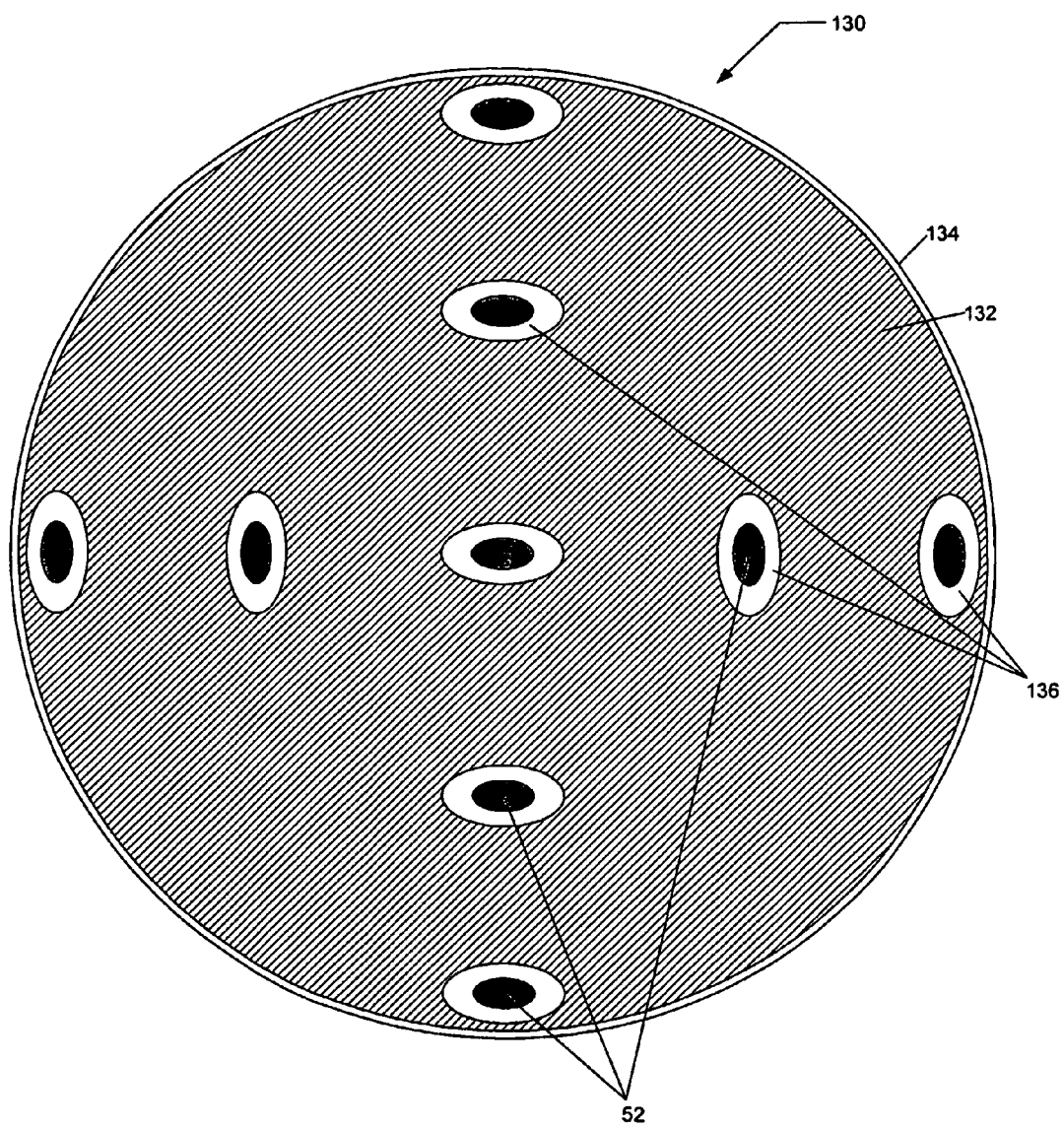
FIG. 7B shows a top view of a substrate holder incorporating an arc suppression system according to another embodiment of the present invention.
Figure 7C:
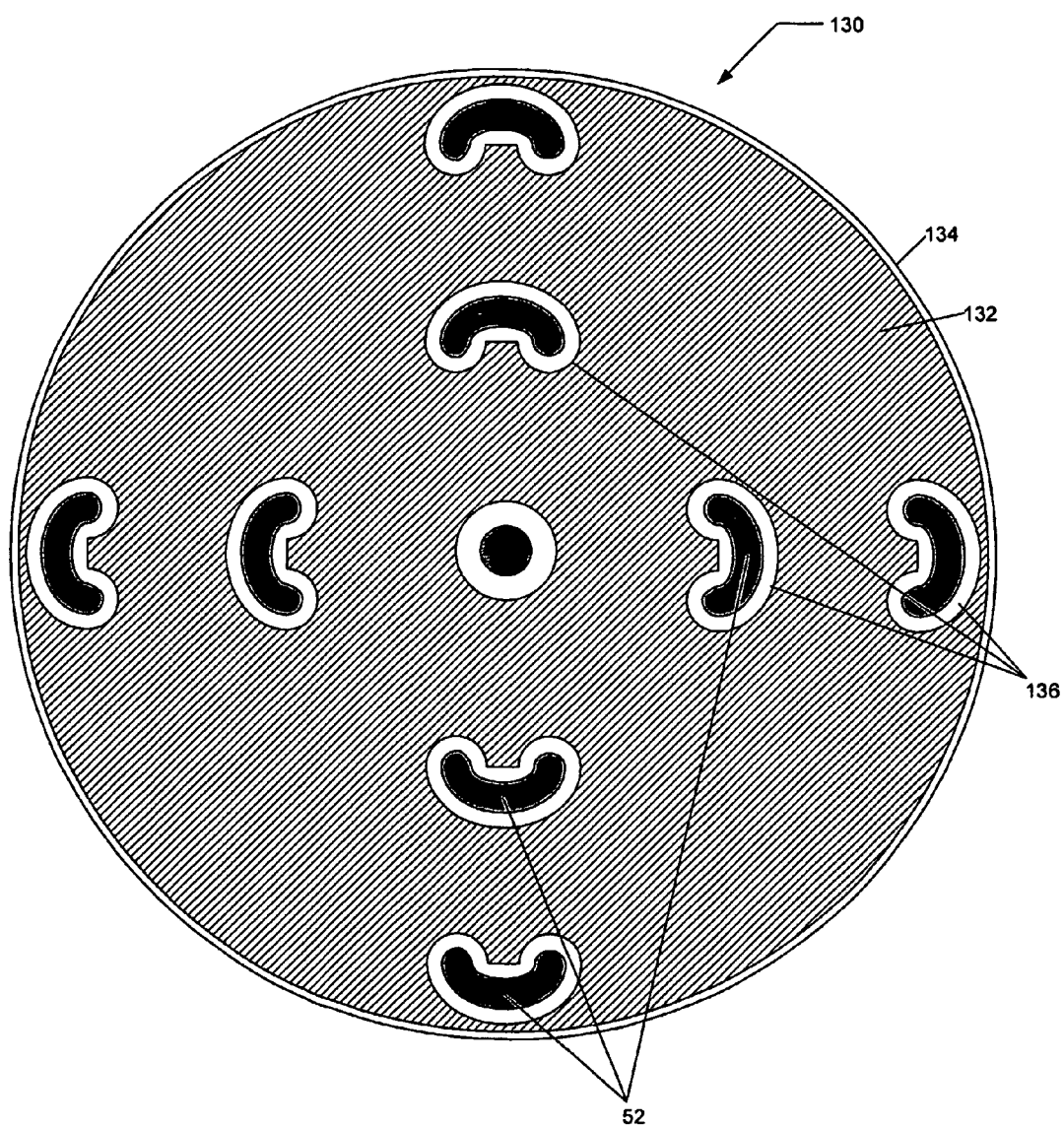
FIG. 7C shows a top view of a substrate holder incorporating an arc suppression system according to another embodiment of the present invention.
Figure 7D:
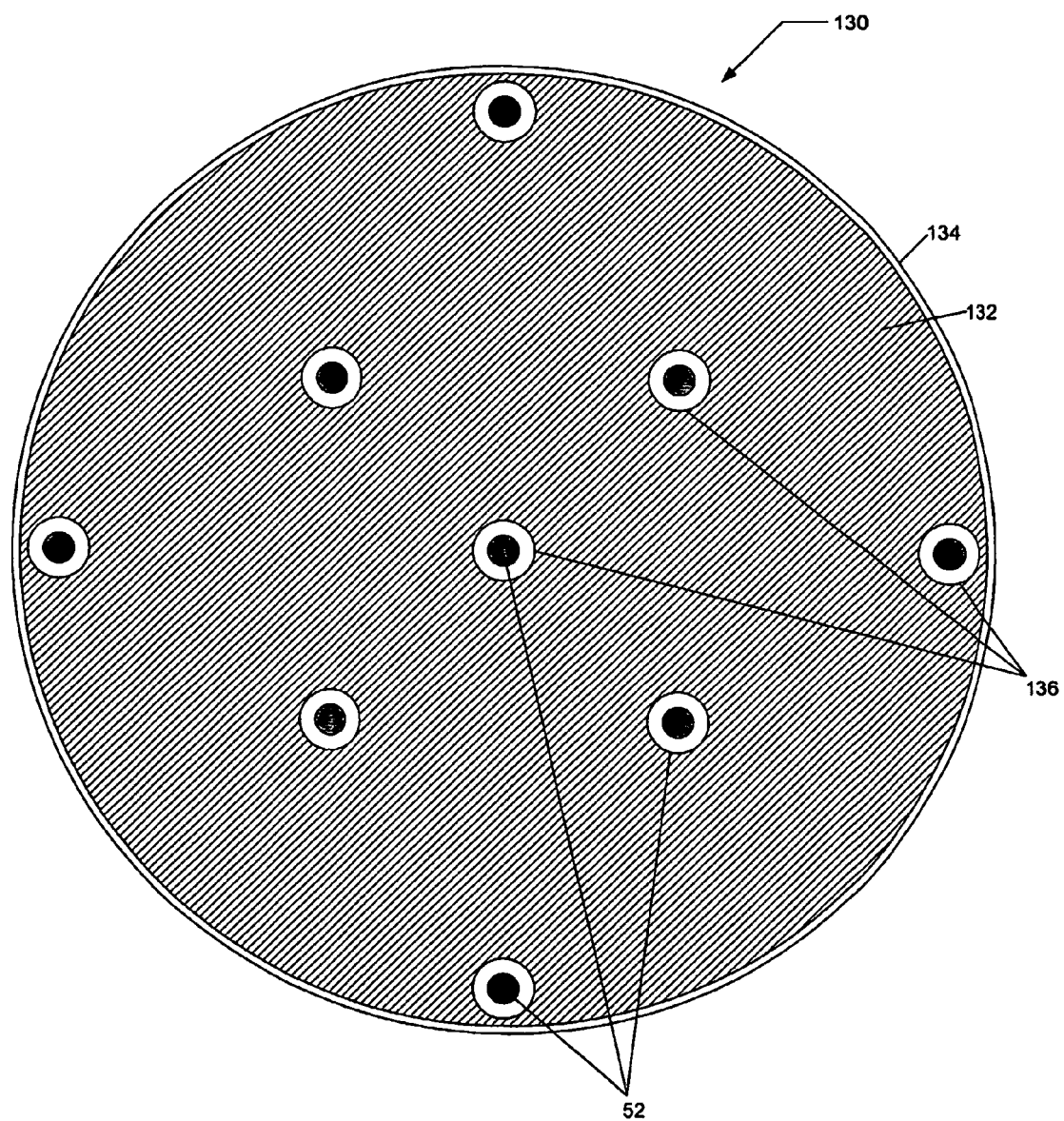
FIG. 7D shows a top view of a substrate holder incorporating an arc suppression system according to another embodiment of the present invention.

As depicted in FIG. 6 (cross-sectional, side view) as well as FIG. 7A (top view), at least one sensor 50 is coupled to substrate holder 20. For example, the at least one sensor 50 can comprise at least one antenna electrode 52, at least one antenna lead 54, and at least one electrical measurement device 56. The at least one antenna electrode 52 can be embedded within the ceramic layer 134 proximate an upper surface thereof, wherein at least one antenna lead 54 extends through openings 136 in clamp electrode 132 and couples to the at least one antenna electrode 52. The at least one antenna lead 54, that is coupled to the at least one antenna electrode 52, can be further coupled to at least one electrical measurement device 56. The at least one sensor 50 measures at least one electrical signal that is, in turn, coupled to controller 55. In an alternate embodiment, as shown in FIG. 7B, the at least one antenna electrode 52 can be elliptical. In an alternate embodiment, as shown in FIG. 7C, the at least one antenna electrode 52 can be "kidney-shaped." In an alternate embodiment, the at least one electrode 52 can be rectangular. Alternate embodiments, such as shown in FIG. 7D, can vary the arrangement of the antenna electrodes 52 to place them in various locations. However, it should be appreciated that any arrangement of antennas and any number of antennas can be used according to the present invention.

In reference to clamp electrode 132, the at least one antenna electrode 52 and the conductive element(s) of the at least one antenna lead 54 can be fabricated from copper or a like conducting material. In a preferred embodiment, the at least one antenna lead 54 is shielded using an outer conductive shield and insulated from the clamp electrode 132 and RF biasable electrode 126.

Figure 8A:
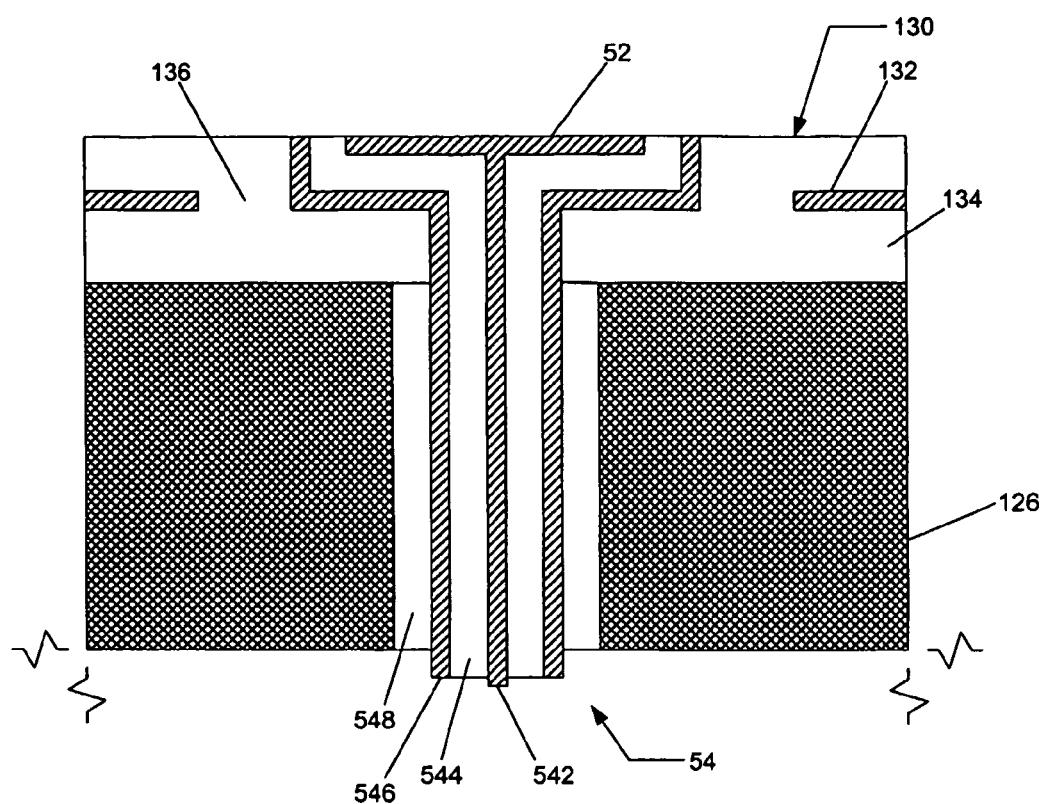
FIG. 8A shows an exploded view of an antenna electrode and antenna lead according to an embodiment of the present invention.
Figure 8B:
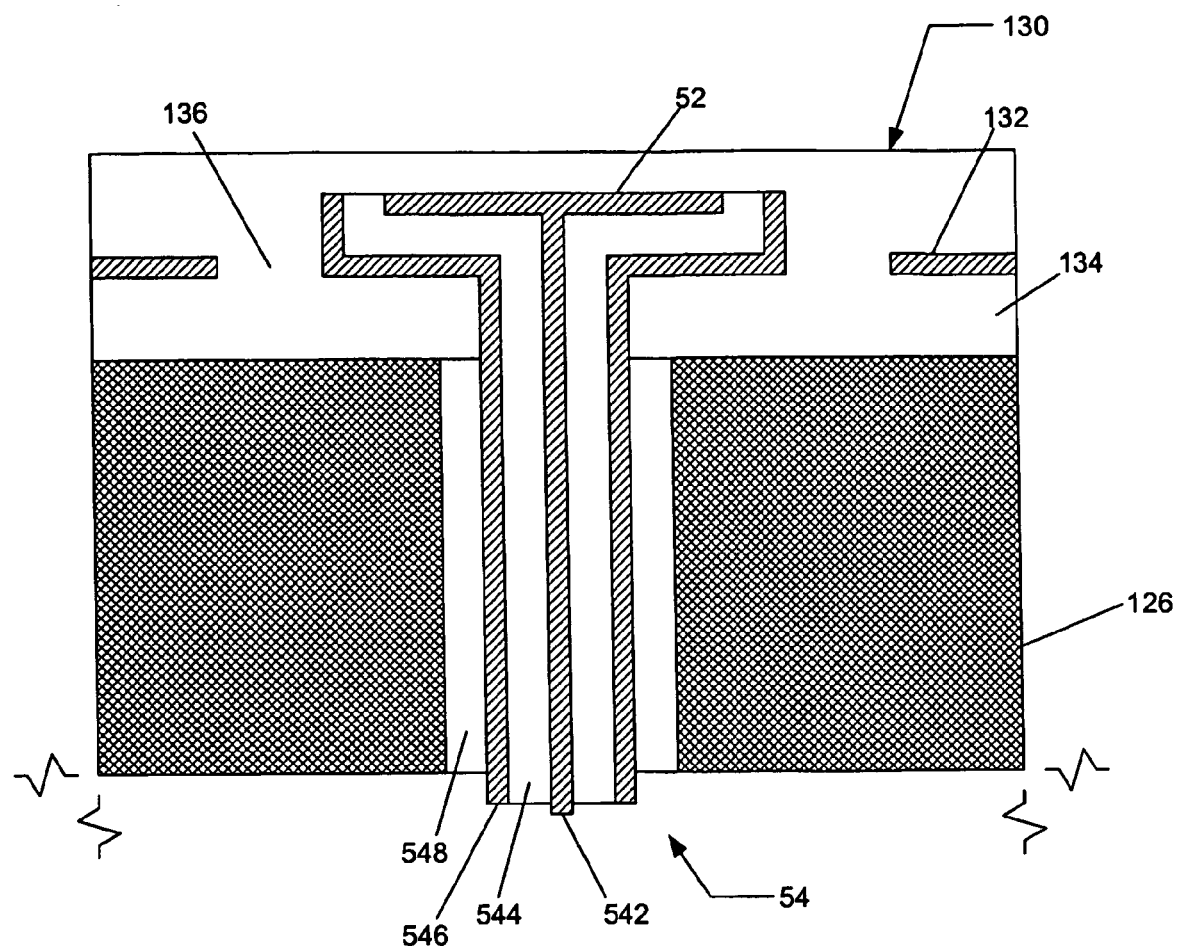
FIG. 8B shows an exploded view of an antenna electrode and antenna lead according to another embodiment of the present invention.

FIG. 8A provides an exploded view of an antenna electrode 52 and antenna lead 54 embedded within an electrostatic clamping device 130 and RF biasable electrode 126. The antenna lead 54 comprises an inner conductive element 542, an inner dielectric element 544, an outer conductive element 546, and an outer dielectric element 548. The inner dielectric element 544 surrounds the inner conductive element 542 and insulates the inner conductive element 542 from an outer conductive element 546. The outer conductive element 546 surrounds the inner dielectric element 544 and shields the inner conductive element 542. The outer dielectric element 548 surrounds the outer conductive element 546 and insulates the outer conductive element 546 from the RF biasable electrode 126. Desirably, the outer conductive element 546 is coupled to electrical ground. In an alternate embodiment, as shown in FIG. 8B, the upper surface of antenna electrode 52 is not coplanar with the upper surface of ceramic layer 134.

The electrostatic clamping device 130, comprises clamp electrode 132, insulation layer 134, and at least one embedded antenna electrodes 52 with at least one antenna leads 54. Such an electrostatic clamping device 130 can be fabricated using sintering techniques, casting techniques and/or thin film forming techniques (such as, for example, chemical vapor deposition (CVD)), which have become standards in the industry and are now well known to those skilled in the art of electrostatic chuck fabrication. Exemplary techniques are disclosed in U.S. Pat. Nos. 5,539,179, 5,625,526 and 5,701,228 (all three are assigned to Tokyo Electron Limited); each of which is incorporated herein by reference in their entirety.

As shown in FIG. 6, at least one electrical measurement device 56 is connected to the at least one antenna lead to perform, for example, a RF voltage measurement. Each electrical measurement device 56 can be, for example, a (high impedance) Tektronix P6245 1.5 GHz 10X Active Probe manufactured by Tektronix. The signal produced by the at least one sensor 50 can be input to the controller 55 such as, for example, a digital signal processor (DSP) using, for example, an analog-to-digital (A/D) converter.

Figure 8C:
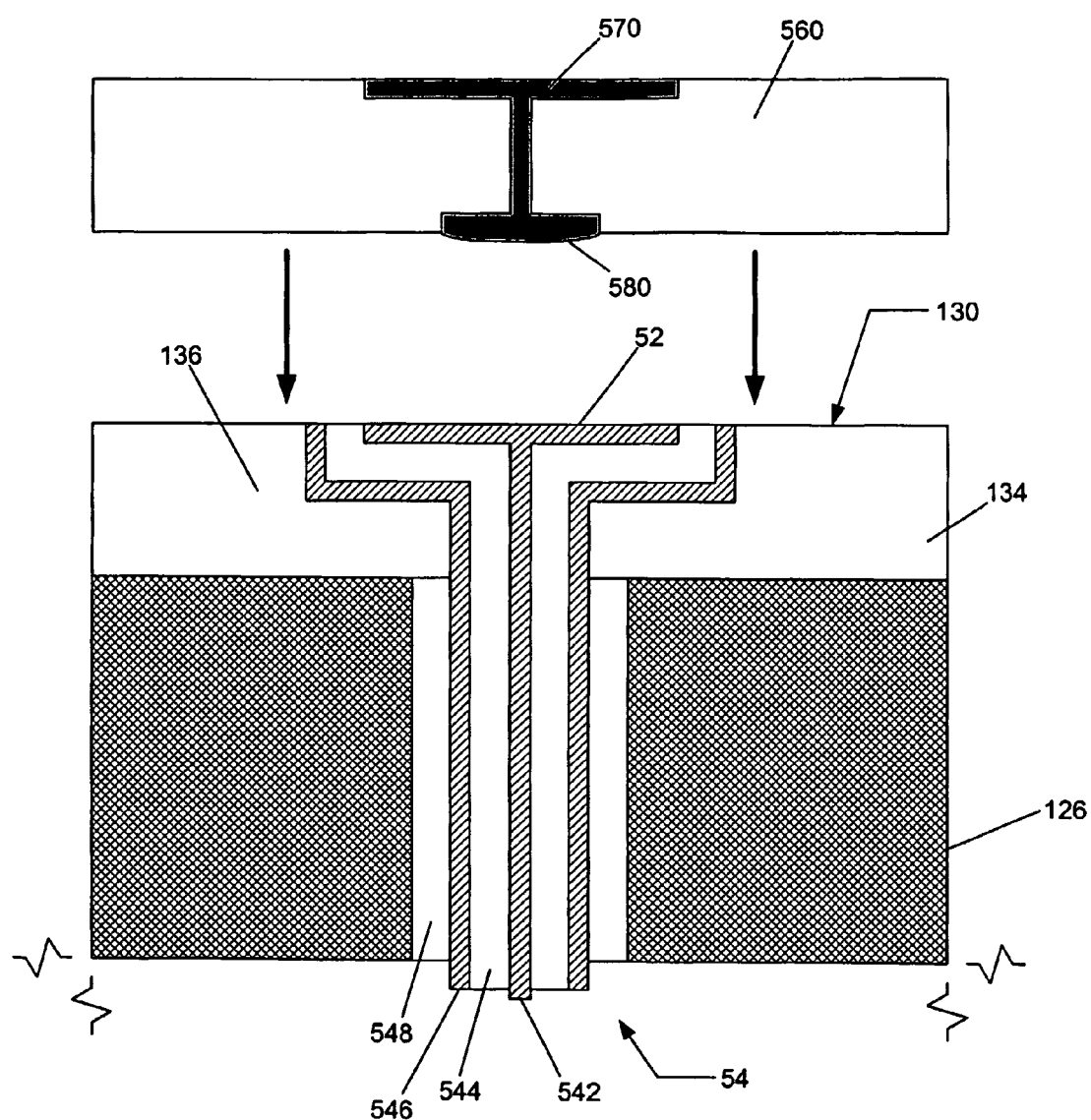
FIG. 8C shows an exploded view of an antenna electrode and antenna lead according to another embodiment of the present invention.
Figure 8D:
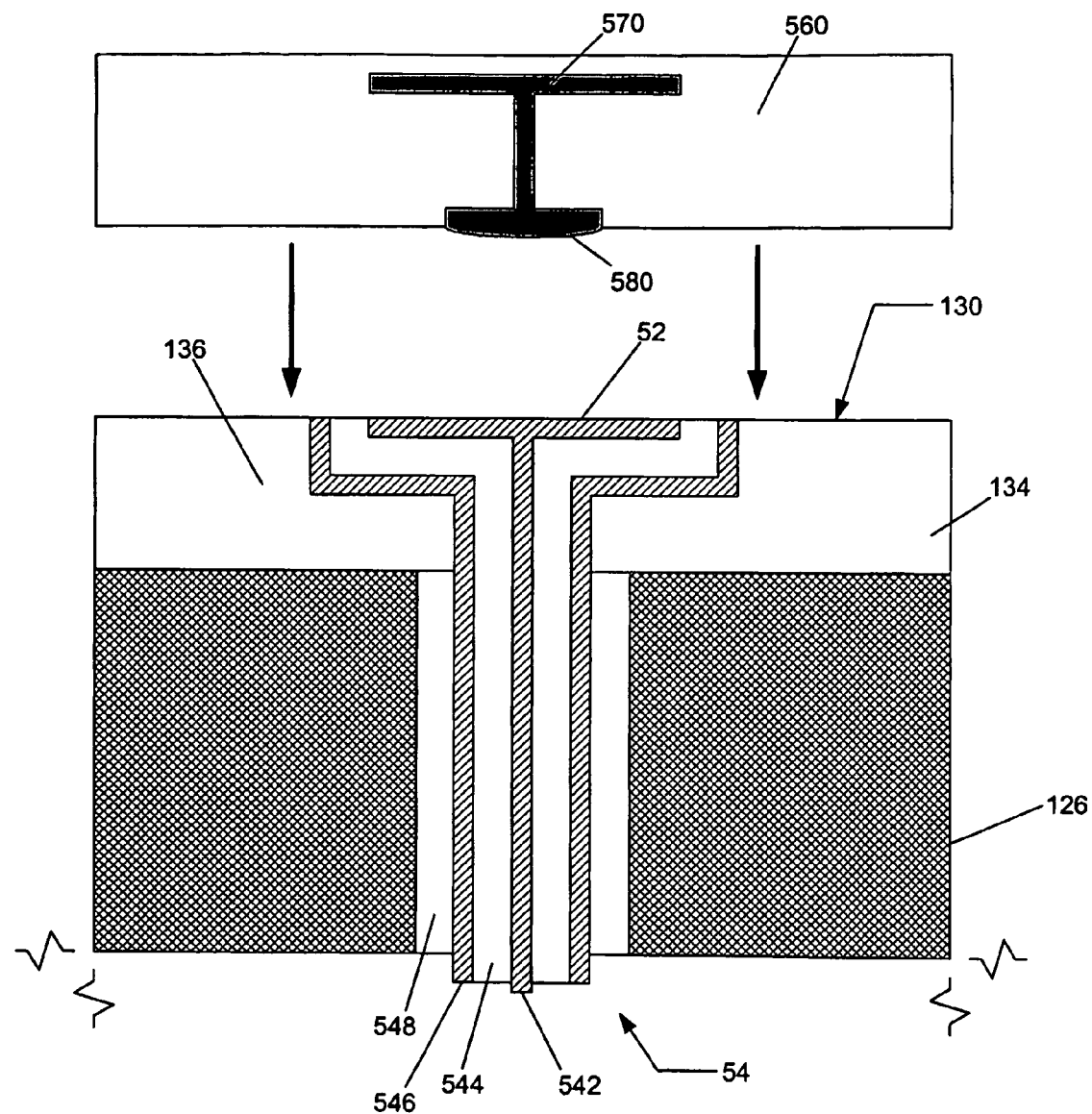
FIG. 8D shows an exploded view of an antenna electrode and antenna lead according to another embodiment of the present invention.

Although antenna electrodes 52 and antenna leads 54 have been shown, in FIGS. 6 and 8A–8D, to be fabricated within the electrostatic clamping device 130 and RF biasable electrode 126, the antenna electrodes 52 and antenna leads 54 can be fabricated within other structures such as, for example, the focus ring 128, the dielectric ring 124, the outer shield 122, a shield ring, a chamber wall, a chamber liner, etc. For example, FIGS. 8C and 8D present a consumable electrode 570 embedded within a focus ring 560 resting atop RF biasable electrode 126, wherein the consumable electrode 570 can comprise a convex surface 580 for electrically coupling the consumable electrode 570 to the antenna electrode 52. In FIG. 8C, the consumable electrode 570 is coplanar with the upper surface of the focus ring 560, and in FIG. 8D the consumable electrode 570 is not coplanar with the upper surface of the focus ring 560. In conventional systems, the focus ring 560 is designed for repeatable replacement on the RF biasable electrode 126 and, therefore, consumable electrode 570 can be consistently coupled to antenna electrode 52. The focus ring 128 or 560 can, for example, comprise at least one of silicon, silicon carbide, alumina, or quartz. In addition, consumable electrode 570 can, for example, comprise doped silicon or an embedded, conductive material such as tungsten.

Figure 9:
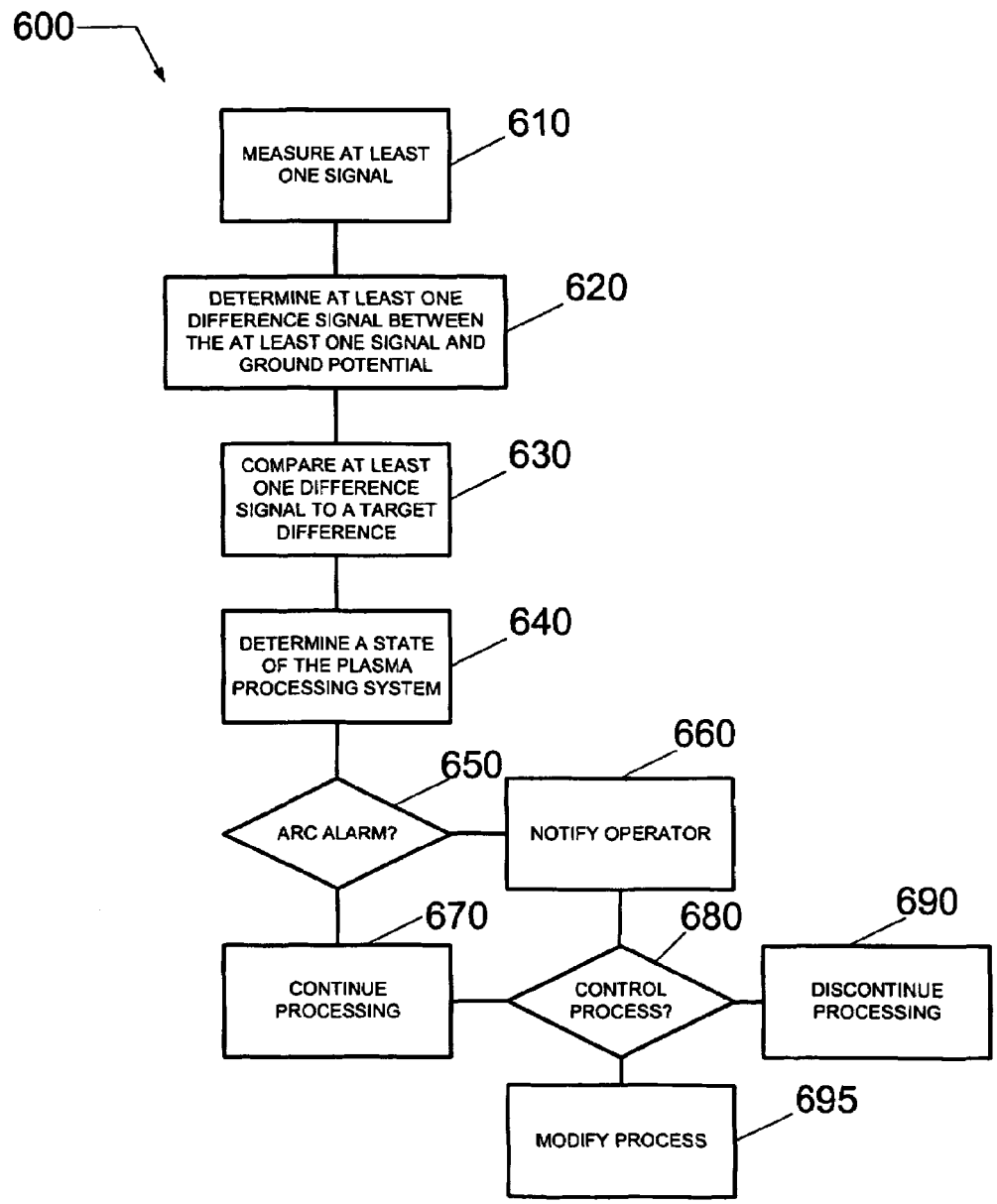
FIG. 9 presents a flow diagram for an arc suppression procedure according to an embodiment of the present invention.

Methods of using an arc suppression system are now discussed. FIG. 9 presents a flow diagram for an arc suppression procedure according to an embodiment of the present invention. Procedure 600 begins with 610 wherein at least one signal is measured using the at least one sensor. For example, the at least one sensor can comprise at least one antenna electrode coupled to at least one antenna lead coupled to at least one electrical measurement device. The signal can be, for example, a time varying voltage signal or a time varying voltage amplitude measured using, for example, a voltage probe. In an alternate embodiment, the signal measured by the sensor can be filtered using a low-pass, high-pass, and/or band-pass filter. The filtered signal can be, for example, a filtered time varying voltage signal or a filtered time varying voltage amplitude. In 620, the measured signal and/or filtered signal is compared to a reference to determine a difference signal. For example, a ground potential or another potential point in the system can be used as the reference. The difference signal can be, for example, the difference between the instantaneous value of the signal measured at an instant in time and electrical ground, the amplitude of the measured signal, the difference between the instantaneous value of the filtered signal measured at an instant in time and electrical ground, or the amplitude of the filtered signal. For example, the difference signal can be determined from the operation of subtraction.

Figure 10:
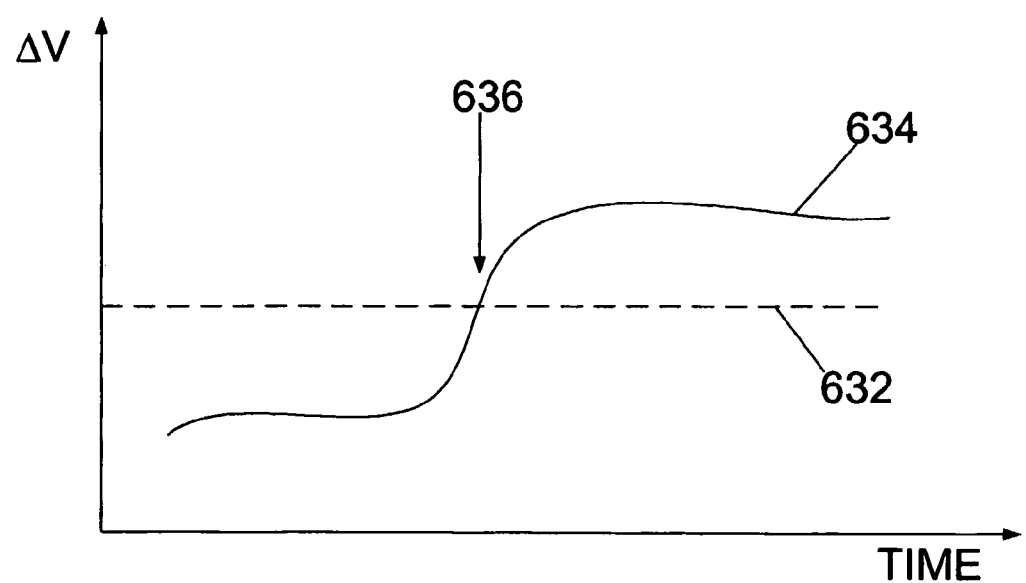
FIG. 10 shows an exemplary signal utilized by the arc suppression system to determine a state of the processing plasma and control the plasma processing system to avoid an arcing event according to an embodiment of the present invention.

In 630, the difference signal is compared to a target difference as shown in FIG. 10. FIG. 10 presents an exemplary difference signal 634 plotted in time, with a target difference 632 (indicated by the dashed line) overlaid. By inspection, the time 636 in which the measured difference signal exceeds the target difference is indicated by the arrow. In 640, a state of the plasma processing system is determined using the comparison in 630. For example, if the difference signal exceeds the target difference, then the probability for an arcing event is relatively high; and if the at least one difference signal does not exceed the target difference, then the probability for an arcing event is relatively low. Based on the determination of 640, a decision for presenting an arc alarm is made in 650. For example, if the probability for an arcing event is relatively high, then an operator is notified in 660, and if the probability for an arcing event is relatively low, then processing continues in 670.

Furthermore, in the event of an arc alarm, the process can be controlled following notification of an operator in 660. In 680, a decision is made to control the process including continuing the process in 670, discontinuing the process in 690, and modifying the process in 695. In an alternate embodiment, the decision to control the process in 680 is performed concurrently with the notification of an operator in 660 by the controller. In an alternate embodiment, the decision to control the process in 680 is performed concurrently with simply a logging of the probability for an arcing event in 660. In an alternate embodiment, the decision to control the process in 680 is performed with no notification of an operator in 660. In 695, the process can be modified by adjusting a process parameter. For example, the process parameter can include the process pressure, substrate holder RF bias, electrostatic clamp electrode bias, backside gas pressure, process gas flow rate(s), etc.

Figure 11:
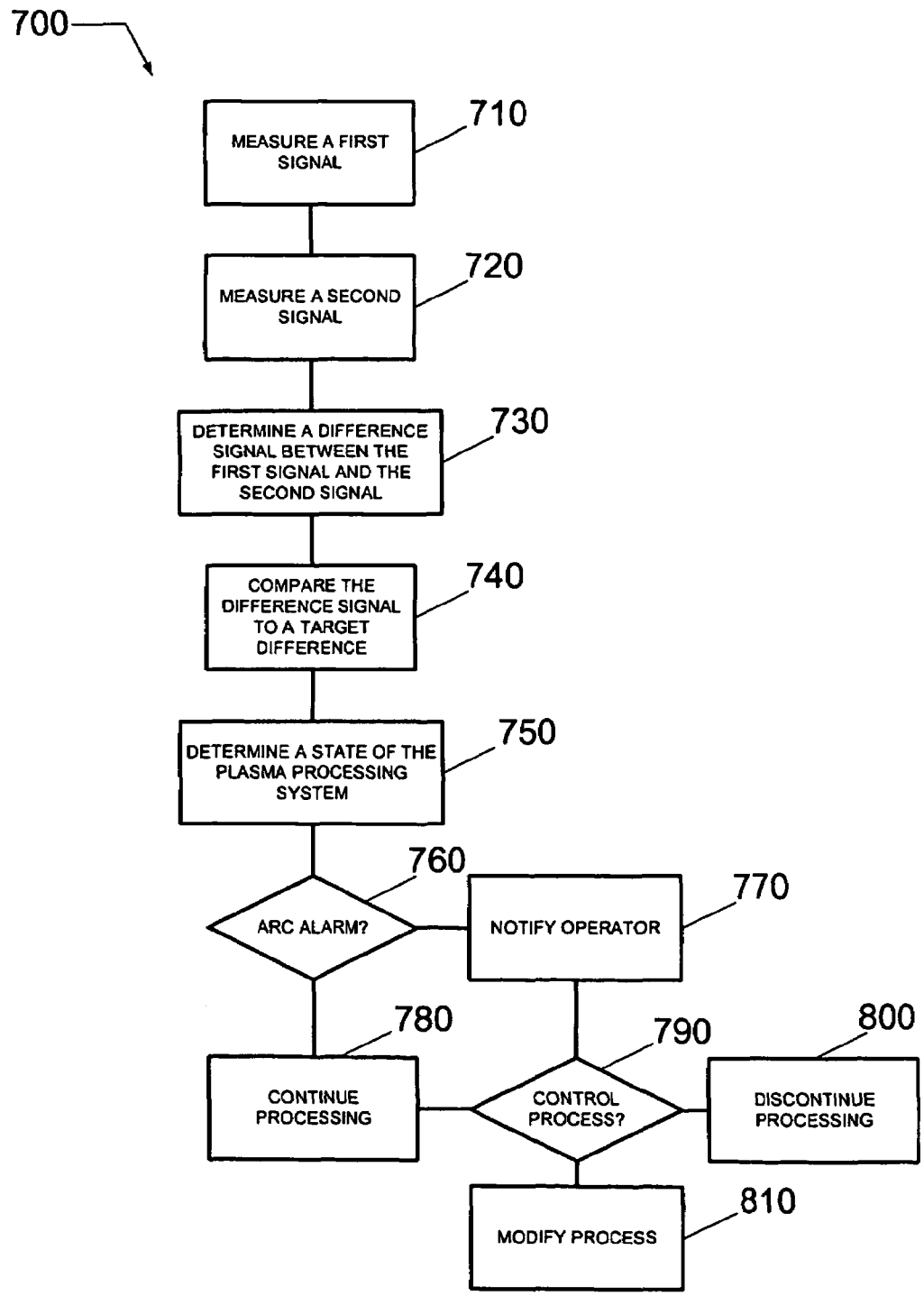
FIG. 11 presents a flow diagram for an arc suppression procedure according to another embodiment of the present invention.

FIG. 11 presents a flow diagram for an arc suppression procedure according to an alternate embodiment of the present invention. Procedure 700 begins with 710 wherein a first signal related to the plasma processing system is measured using a first sensor. For example, the first sensor can comprise a first antenna electrode coupled to a first antenna lead coupled to a first electrical measurement device. The first signal can be, for example, derived from a first region of the substrate. The first signal can be, for example, a time varying voltage signal or a time varying voltage amplitude measured using, for example, a voltage probe. In an alternate embodiment, the first signal measured by the first sensor can be filtered using a low-pass, high-pass, and/or band-pass filter. The filtered signal can be, for example, a filtered time varying voltage signal or a filtered time varying voltage amplitude.

In 720, a second signal related to the plasma processing system is measured using a second sensor. For example, the second sensor can comprise a second antenna electrode coupled to a second antenna lead coupled to a second electrical measurement device. The second signal can be, for example, derived from a second region of the substrate. The second signal can be, for example, a time varying voltage signal or a time varying voltage amplitude measured using, for example, a voltage probe. In an alternate embodiment, the second signal measured by the second electrical sensor can be filtered using a low-pass, high-pass, and/or band-pass filter. The filtered signal can be, for example, a filtered time varying voltage signal or a filtered time varying voltage amplitude. Preferably, the acquisition of the first signal and the second signal is performed at the same instant in time.

In one embodiment, the first signal corresponds to a location proximate the substrate center and the second signal corresponds to a location proximate the substrate edge. In another embodiment, the first signal corresponds to a location proximate the substrate edge and the second signal corresponds to a location proximate the focus ring.

In another embodiment, the first signal corresponds to a first location and a first time for measurement, and the second signal corresponds to the first location and a second time for the measurement. The measurement of a first signal and a second signal at the same location; however, different time, can permit checking the rate of change of the measurement.

In 730, a difference signal is determined by comparing the first signal and the second signal at each instant of time. The difference signal can be, for example, the difference between the instantaneous value of the first signal and the instantaneous value of the second signal, the amplitude of the first signal and the amplitude of the second signal, the difference between the instantaneous value of the filtered first signal and the instantaneous value of the filtered second signal, or the amplitude of the filtered first-signal and the amplitude of the filtered second signal.

In 740, the difference signal is compared to a target difference as shown in FIG. 10. FIG. 10 presents an exemplary difference signal 634 plotted in time, with a target difference 632 (indicated by the dashed line) overlaid. By inspection, the time 636 in which the measured difference signal exceeds the target difference is indicated by the arrow. In 750, a state of the plasma processing system is determined using the comparison in 740. For example, if the difference signal exceeds the target difference, then the probability for an arcing event is relatively high; and if the difference signal does not exceed the target difference, then the probability for an arcing event is relatively low. Based on the determination of 750, a decision for presenting an arc alarm is made in 760. For example, if the probability for an arcing event is relatively high, then an operator is notified in 770, and if the probability for an arcing event is relatively low, then processing continues in 780.

When two or more signals are utilized, additional information can be presented. For example, the location for the highest probability for arcing can be determined by monitoring those regions where the magnitude of the difference signal is greatest.

Furthermore, in the event of an arc alarm, the process can be controlled following notification of an operator in 770. In 790, a decision is made to control the process including continuing the process in 780, discontinuing the process in 800 and modifying the process in 810. In an alternate embodiment, the decision to control the process in 790 is performed concurrently with the notification of an operator in 770 by the controller. In an alternate embodiment, the decision to control the process in 790 is performed concurrently with simply a logging of the probability for an arcing event in 770. In an alternate embodiment, the decision to control the process in 790 is performed with no notification of an operator in 770. In 810, the process can be modified by adjusting a process parameter. For example, the process parameter can include the process pressure, substrate holder RF bias, electrostatic clamp electrode bias, backside gas pressure, process gas flow rate(s), etc.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A plasma processing system, comprising:
   a process reactor configured to facilitate formation of plasma; and
   an arc suppression system coupled to said process reactor, said arc suppression system comprising at least one sensor configured to produce at least one signal related to said plasma; and
   a controller coupled to said at least one sensor, wherein said controller is configured to determine a state of a probability of occurrence of arcing in said plasma processing system using said at least one signal and to control said plasma processing system according to said state to reduce the probability of occurrence of an arcing event.

2. The plasma processing system as recited in claim 1, wherein said at least one sensor comprises at least one antenna embedded within at least one of a substrate holder, a chamber wall and a chamber liner.

3. The plasma processing system as recited in claim 2, wherein said at least one antenna comprises at least one antenna electrode and an antenna lead coupled to each antenna electrode of the at least one antenna electrode.

4. The plasma processing system as recited in claim 3, wherein said antenna lead comprises an inner conductive element and an inner dielectric element.

5. The plasma processing system as recited in claim 4, wherein said antenna lead further comprises an outer conductive element and an outer dielectric element.

6. The plasma processing system as recited in claim 2, further comprising an electrical measurement device configured to connect to said at least one antenna.

7. The plasma processing system as recited in claim 2, said at least one antenna being embedded within said substrate holder which comprises at least one of a RF biasable electrode, an electrostatic clamping device, an outer shield, an isolation ring, a focus ring, a dielectric ring, and a shield ring.

8. The plasma processing system as recited in claim 2, wherein said substrate holder comprises at least one of an electrostatic clamping system and a backside gas system.

9. The plasma processing system as recited in claim 6, wherein the electrical measurement device comprises a voltage probe.

10. The plasma processing system as recited in claim 1, wherein said at least one signal related to said plasma is at least one of a time varying voltage signal and a time varying voltage amplitude.

11. The plasma processing system as recited in claim 1, wherein said at least one signal related to said plasma comprises a filtered signal.

12. The plasma processing system as recited in claim 11, wherein said filtered signal is derived from said at least one signal using at least one of a low-pass filter, a high-pass filter, and a band-pass filter.

13. The plasma processing system as recited in claim 1, wherein said at least one sensor comprises a plurality of sensors and said controller is configured to determine a state of a probability of occurrence of arcing at different regions in said plasma processing system.

14. The plasma processing system as recited in claim 1, wherein said controlling said plasma processing system according to said state of said plasma in order to suppress the arcing event comprises performing at least one of alerting an operator, continuing a process, modifying a process and discontinuing a process.

15. An arc suppression system comprising:
at least one sensor configured to couple to a plasma processing system; and
a controller configured to execute at least one algorithm for determining a state of a probability of occurrence of arcing in said plasma processing system using said at least one signal related to said plasma processing system and controlling said plasma processing system according to said state in order to reduce the probability of occurrence of an arcing event.

16. The arc suppression system as recited in claim 15, wherein said at least one sensor comprises at least one antenna embedded within at least one of a substrate holder, a chamber wall and a chamber liner.

17. The plasma processing system as recited in claim 16, wherein said at least one antenna comprises at least one antenna electrode and an antenna lead coupled to each antenna electrode of the at least one antenna electrode.

18. The arc suppression system as recited in claim 17, wherein said antenna lead comprises an inner conductive element and an inner dielectric element.

19. The arc suppression system as recited in claim 18, wherein said antenna lead further comprises an outer conductive element and an outer dielectric element.

20. The arc suppression system as recited in claim 16, further comprising an electrical measurement device configured to connect to said at least one antenna.

21. The arc suppression system as recited in claim 15, wherein said at least one antenna embedded with said substrate holder comprises at least one antenna embedded in at least one of a RF biasable electrode, an electrostatic clamping device, an outer shield, an isolation ring, a focus ring a dielectric ring, and a shield ring.

22. The arc suppression system as recited in claim 16, wherein said substrate holder comprises at least one of an electrostatic clamping system and a backside gas system.

23. The arc suppression system as recited in claim 20, wherein said electrical measurement device comprises a voltage probe.

24. The arc suppression system as recited in claim 15, wherein said at least one signal related to said plasma is at least one of a time varying voltage signal and a time varying voltage amplitude.

25. The arc suppression system as recited in claim 15, wherein said at least one signal related to said plasma comprises a filtered signal.

26. The arc suppression system as recited in claim 25, further comprises at least one of a low-pass filter, a high-pass filter, and a band-pass filter configured to derive said filtered signal from said at least one signal.

27. The arc suppression system as recited in claim 15, wherein said at least one sensor comprises a plurality of sensors and said controller is configured to determine a state of a probability of occurrence of arcing at different regions in said plasma processing system.

28. The arc suppression system as recited in claim 15, wherein said controlling said plasma processing system according to said state of said plasma in order to suppress an arcing event comprises performing at least one of alerting an operator, continuing a process, modifying a process and discontinuing a process.

29. A method for suppressing arcing in a plasma processing system utilizing an arc suppression system comprising at least one sensor coupled to said plasma processing system, and a controller coupled to said at least one sensor, the method comprising:
measuring at least one signal related to said plasma processing system using said at least one sensor;
determining at least one difference signal between said at least one signal and a reference signal;
comparing said at least one difference signal to a target difference;
determining a state of a probability of occurrence of arcing in said plasma processing system from said comparing; and
controlling said plasma processing system in order to reduce the probability of occurrence of an arcing event,
wherein said at least one signal is measured using at least one sensor that comprises at least one antenna embedded within at least one of a substrate holder, a chamber wall and a chamber liner.

30. The method as recited in claim 29, wherein said measuring further comprises filtering said at least one signal.

31. The method as recited in claim 30, wherein said filtering comprises using at least one of a low-pass filter, a high-pass filter, and a band-pass filter.

32. The method as recited in claim 30, wherein said filtering provides at least one of a filtered time varying signal and a filtered time varying amplitude.

33. The method as recited in claim 29, wherein said determining at least one difference signal between said at least one signal and said reference signal comprises subtracting said reference signal from said at least one signal.

34. The method as recited in claim 29, wherein said at least one difference signal comprises at least one of a difference between an instantaneous value of said at least one signal measured at an instant in time and said reference signal, an amplitude of said at least one signal and said reference signal, an instantaneous value of a filtered said at least one signal measured at an instant in time and said reference signal, and amplitude of a filtered said at least one signal and said reference signal.

35. The method as recited in claim 29, wherein said measuring comprises measuring a plurality of signals at different regions of the plasma processing system using a plurality of respective sensors, and said determining comprises determining a state of a probability of an occurrence of arcing at said different regions in said plasma processing system.

36. The method as recited in claim 29, wherein said probability for the occurrence of arcing in said plasma processing system comprises at least one of a high probability and a low probability.

37. The method as recited in claim 29, wherein said method further comprises controlling said plasma processing system according to said state of said plasma processing system in order to suppress an arcing event.

38. The method as recited in claim 33, wherein said controlling comprises at least one of notifying an operator, continuing a process, discontinuing a process, and modifying a process.

39. The method as recited in claim 38, wherein said modifying a process comprises adjusting at least one of a process pressure, a substrate holder RF bias, an electrostatic clamp electrode bias, a backside gas pressure, and a process gas flow rate.

40. The method as recited in claim 29, wherein said reference signal comprises a ground potential.

41. A method for suppressing arcing in a plasma processing system utilizing an arc suppression system comprising at least one sensor coupled to said plasma processing system, and a controller coupled to said at least one sensor, the method comprising:
    measuring a first signal related to said plasma processing system using a first sensor;
    measuring a second signal related to said plasma processing system using a second sensor;
    determining a difference signal between said first signal and said second signal;
    comparing said difference signal to a target difference;
    determining a state of a probability of occurrence of arcing in said plasma processing system based on said comparing; and
    controlling said plasma processing system in order to reduce the probability of occurrence of an arcing event.

42. The method as recited in claim 41, wherein said first signal is measured using at least one sensor that comprises at least one antenna embedded within at least one of a substrate holder, a chamber wall and a chamber liner.

43. The method as recited in claim 41, wherein said measuring the first signal further comprises filtering said first signal.

44. The method as recited in claim 43, wherein said filtering comprises using at least one of a low-pass filter, a high-pass filter, and a band-pass filter.

45. The method as recited in claim 43, wherein said filtering provides at least one of a first filtered time varying signal and a first filtered time varying amplitude.

46. The method as recited in claim 41, wherein said second signal is measured using at least one sensor that comprises at least one antenna embedded within at least one of a substrate holder, a chamber wall and a chamber liner.

47. method as recited in claim 41, wherein said measuring the second signal further comprises filtering said second signal.

48. The method as recited in claim 47, wherein said filtering comprises using at least one of a low-pass filter, a high-pass filter and a band-pass filter.

49. The method as recited in claim 47, wherein said filtering provides at least one of a second filtered time varying signal and a second filtered time varying amplitude.

50. The method as recited in claim 41, wherein said determining a difference signal between said first signal and said second signal comprises subtracting said first signal from said second signal.

51. The method as recited in claim 41, wherein said determining comprises determining a state of the probability for the occurrence of arcing at different regions in said plasma processing system.

52. The method as recited in claim 51, wherein said probability for the occurrence of arcing in said plasma processing system comprises at least one of a high probability and a low probability.

53. The method as recited in claim 43, wherein said method further comprises controlling said plasma processing system according to said state of said plasma processing system in order to suppress an arcing event.

54. The method as recited in claim 53, wherein said controlling comprises at least one of notifying an operator, continuing a process, discontinuing a process, and modifying a process.

55. The method as recited in claim 54, wherein said modifying a process comprises adjusting at least one of a process pressure, a substrate holder RF bias, an electrostatic clamp electrode bias, a backside gas pressure, and a process gas flow rate.

56. The method as recited in claim 41, wherein said measuring a first signal and said measuring a second signal are performed at substantially the same time.

57. The method as recited in claim 41, wherein said measuring a first signal and said measuring a second signal are performed at substantially different times.

58. The method as recited in claim 41, wherein said measuring a first signal corresponds to a first location and said measuring a second signal corresponds to a second location.

59. The method as recited in claim 58, wherein said first location comprises at least one of a substrate center, a substrate edge, and a focus ring; and said second location comprises at least one of a substrate center, a substrate edge, and a focus ring.

60. A plasma processing system, comprising:
    a plasma reactor configured to facilitate formation of plasma; and
    means for arc suppression coupled to plasma reactor, said means for arc suppression comprising means for producing at least one signal related to said plasma; and means for controlling coupled to said at least one sensor, wherein said means for controlling determines a state of a probability of occurrence of arcing in said plasma processing system using said at least one signal and controls said plasma processing system according to said state to reduce the probability of occurrence of an arcing event.

61. The plasma processing system as recited in claim 60, wherein said means for producing at least one signal comprises at least one antenna embedded within at least one of a substrate holder, a chamber wall and a chamber liner.

62. The plasma processing system as recited in claim 60, further comprising an electrical measurement device.

63. The plasma processing system as recited in claim 62, wherein the electrical measurement device comprises a voltage probe.

64. The plasma processing system as recited in claim 60, further comprising housing means for protecting the means for producing the at least one signal from the plasma of the plasma reactor.

* * * * *